United States Patent [19]

Smith et al.

[11] 4,390,789
[45] Jun. 28, 1983

[54] ELECTRON BEAM ARRAY LITHOGRAPHY SYSTEM EMPLOYING MULTIPLE PARALLEL ARRAY OPTICS CHANNELS AND METHOD OF OPERATION

[75] Inventors: Donald O. Smith, Lexington; Kenneth J. Harte, Carlisle, both of Mass.

[73] Assignee: Control Data Corporation, Minneapolis, Minn.

[21] Appl. No.: 266,074

[22] Filed: May 21, 1981

[51] Int. Cl.³ ............................................ H01J 37/00
[52] U.S. Cl. ............................... 250/492.2; 250/442.1; 250/398
[58] Field of Search ............. 250/492.2, 398, 396 ML, 250/442; 315/370; 313/361

[56] References Cited

U.S. PATENT DOCUMENTS

| | | | |
|---|---|---|---|
| 4,097,745 | 6/1978 | Parks | 250/398 |
| 4,130,761 | 12/1978 | Matsuda | 250/492.2 |
| 4,142,132 | 2/1979 | Harte | 315/370 |
| 4,198,569 | 4/1980 | Takayama | 250/396 ML |
| 4,200,794 | 4/1980 | Newberry et al. | 250/492.2 |
| 4,354,111 | 10/1982 | Williams et al. | 250/492.2 |

*Primary Examiner*—Bruce C. Anderson
*Attorney, Agent, or Firm*—Charles W. Helzer

[57] ABSTRACT

A multi-channel EBAL apparatus and method of operation employing a plurality of parallel operated electron beam channels with each electron beam channel being of the fly's eye array optics type having an electron gun for producing an electron beam, an array lenslet assembly and an associated fine deflector assembly together with a coarse deflector for selectively directing the electron beam to a desired array lenslet within the array lenslet assembly. The associated fine deflector element thereafter directs the electron beam to a desired point on a target surface such as a target semiconductor wafer being processed by electron beam lithography. A common movable stage is provided for supporting the target wafer surfaces below the plurality of parallel operated electron beam channels and for moving the target surfaces in common relative to the array optics axes of all of the electron beam channels. Common movement of all of the target surfaces is achieved automatically in preprogrammed manner preferably along either axis of an x-y translation mechanism. All of the electron beam channels are supported within a common housing which is evacuated along with the movable target platform which serves to move the target surfaces in common. The apparatus can be employed in conjunction with a pattern registration grid mapped with the aid of a lenslet stitching calibration grid and which provides fiducial marking signals for identifying the boundaries of the field of view of the respective lenslets in each electron beam channel as well as the field of view of all of the electron beam channels and for stitching together the required number of the fields of view to thereby cover a desired area of a target surface. Provision is made for accommodating the occurance of any flawed lenslet assemblies by permuting the target surface so as to place any portion of a target surface that had been subject to a flawed lenslet under the view of an unflawed lenslet for subsequent electron beam treatment. Increased production capacity can be obtained by connecting a plurality of such EBAL apparatuses in parallel and controlling them in common by an overall system executive computer.

60 Claims, 9 Drawing Figures

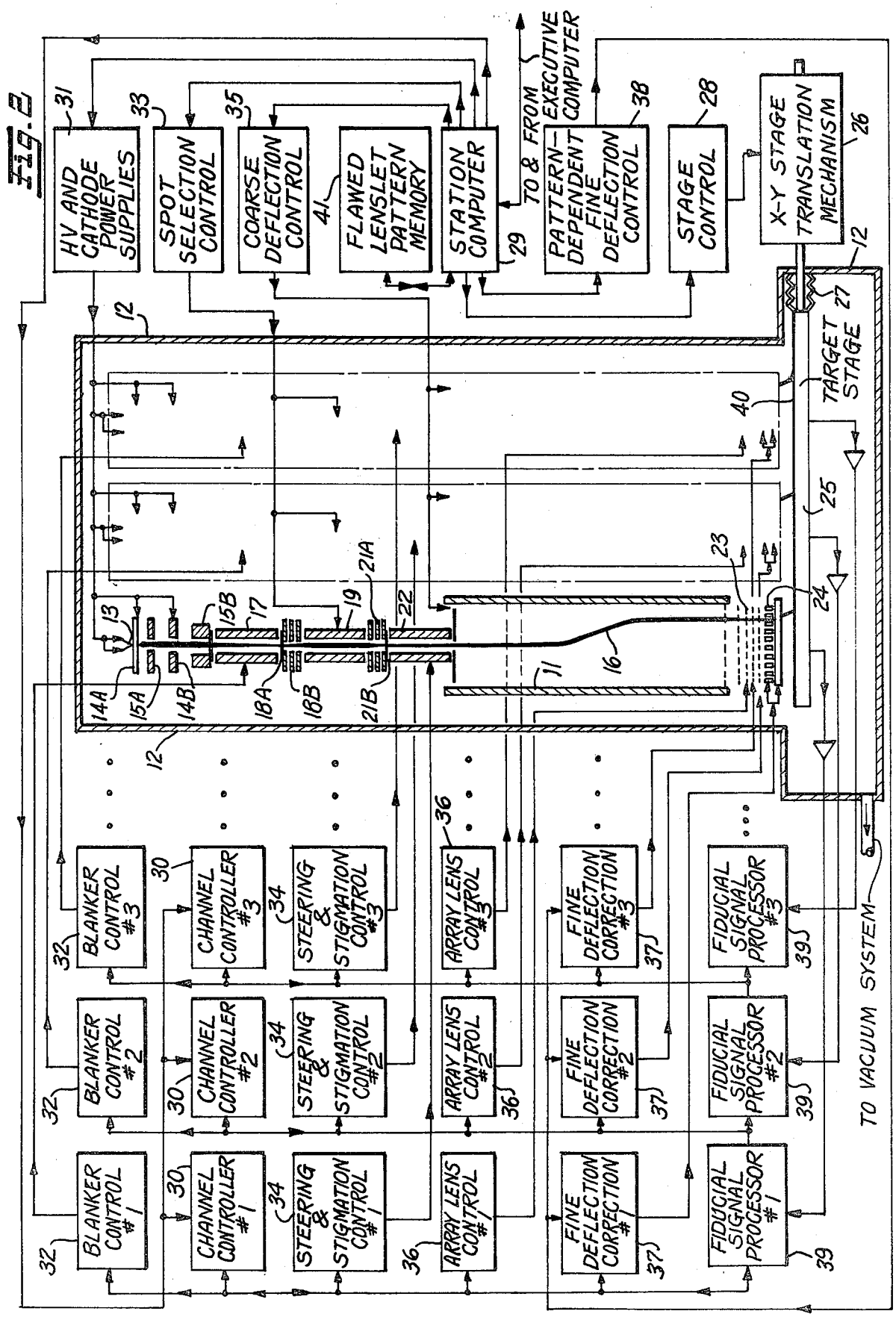

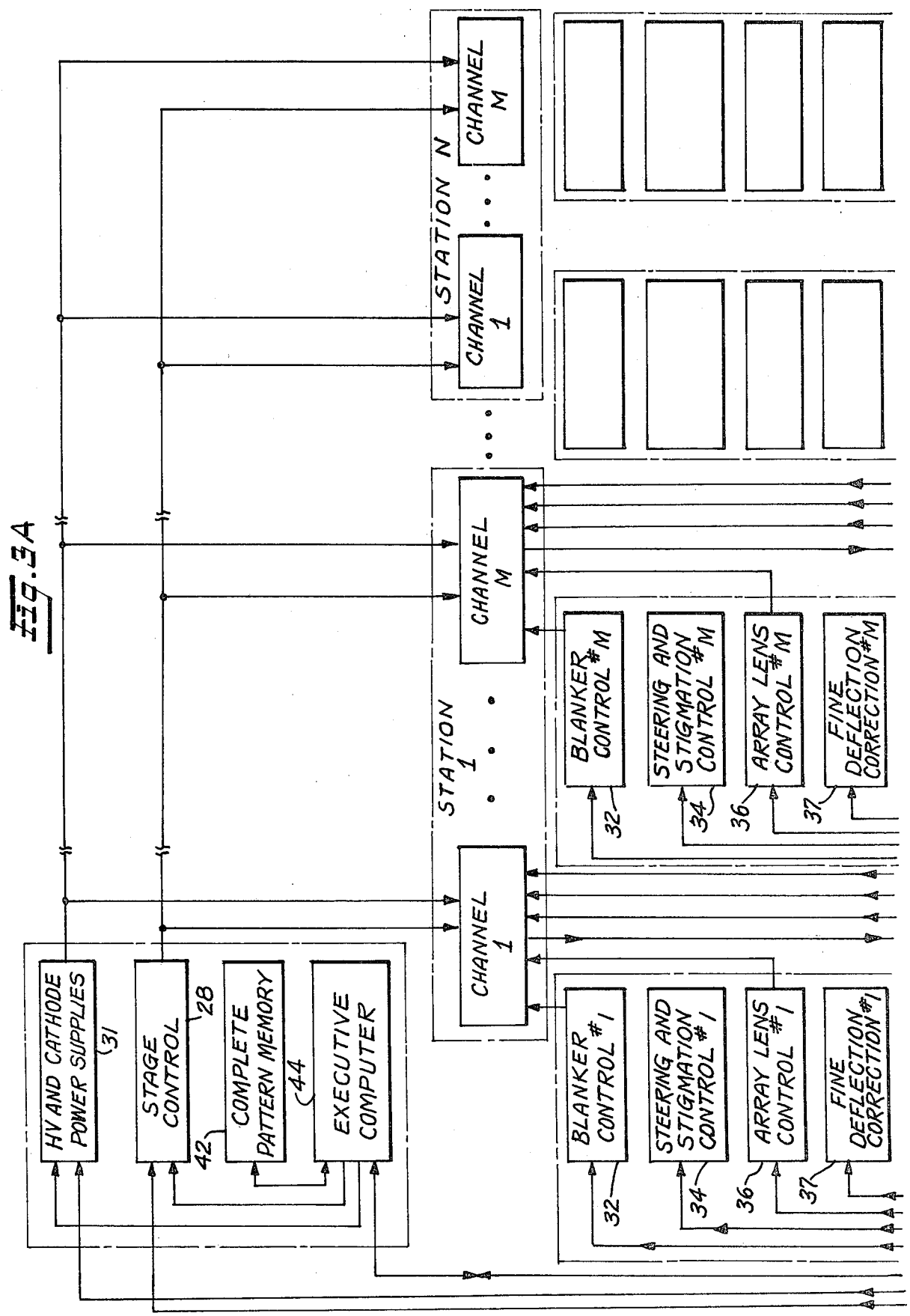

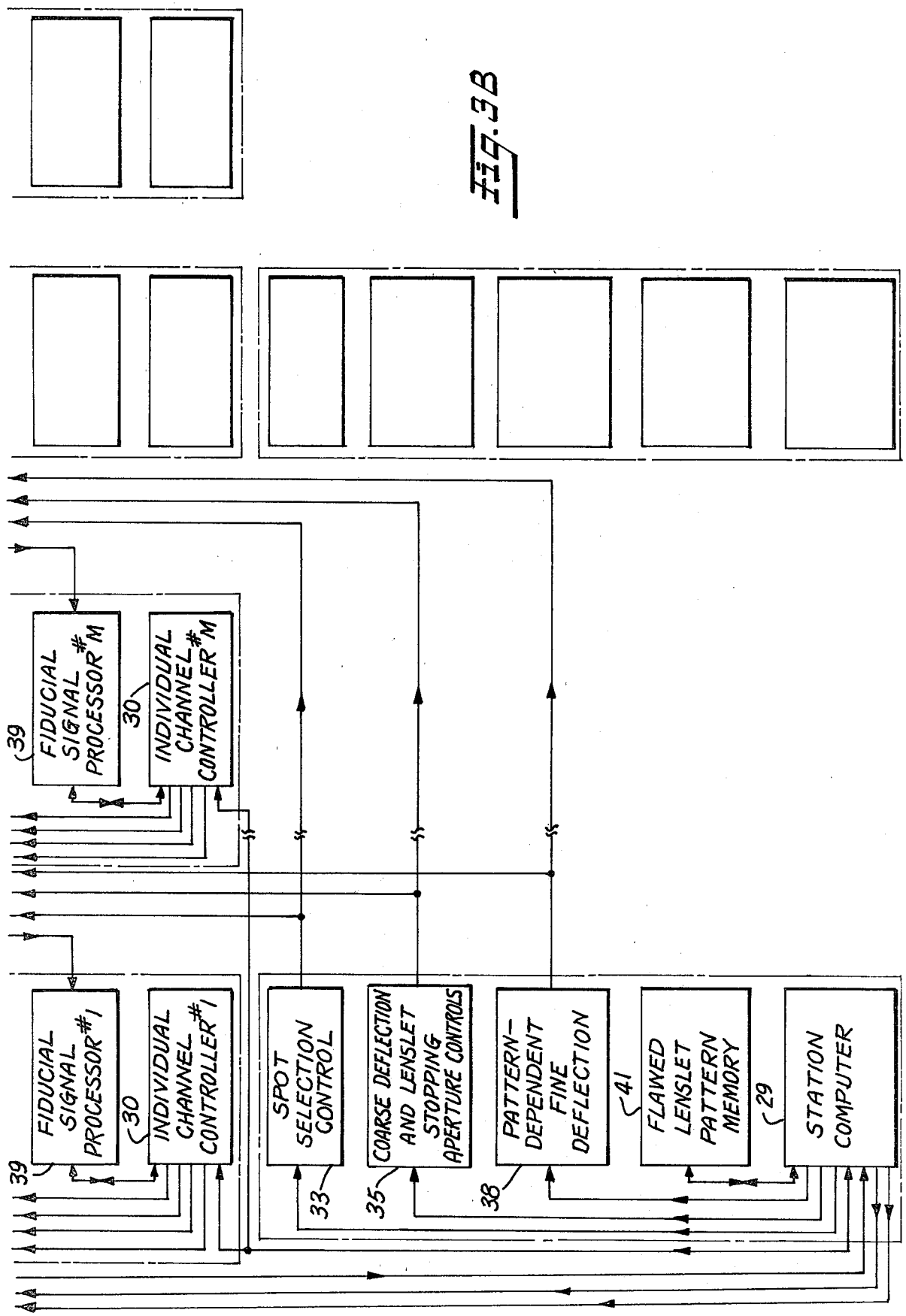

LEGEND
— CHANNEL FIELDS
--- CHIPS
□ CHIP FIDUCIAL MARKS

ELECTRON BEAM ARRAY LITHOGRAPHY SYSTEM EMPLOYING MULTIPLE PARALLEL ARRAY OPTICS CHANNELS AND METHOD OF OPERATION

FIELD OF INVENTION

This invention relates to a multiple channel electron beam array lithography (EBAL) apparatus and system employing multiple parallel electron beam channels of the array optics (fly's eye) type and to its method of operation.

BACKGROUND OF INVENTION

In copending U.S. patent application Ser. No. 254,870 filed Apr. 16, 1981, entitled "Method and Apparatus For Exposing Multi-Level Registered Patterns Interchangeably Between Stations Of A Multi-Station Electron-Beam Lithography System"-Kenneth J. Harte and Donald O. Smith, inventors and assigned to the Control Data Corporation, an EBAL system is described which employs a number of single channel electron beam columns interconnected to operated in parallel as an EBAL system for use in the fabrication of semiconductor integrated circuits and the like. In this system each electron beam channel is contained within its own evacuated housing and requires its own mechanically movable stage for support of a target surface. For certain types of EBAL installations such as arrangement is desirable. However, where it is essential to increase thru-put of an EBAL installation at minimum capital cost, the need for individual electron beam tube evacuated structures and independent target surface mechanical movement devices imposes a practical limit on the ultimate size of the installation both in physical space requirements and cost wise. To overcome this problem the present invention was devised.

SUMMARY OF THE INVENTION

It is therefore a primary object of the invention to provide a new and improved EBAL system and method of operation which employs multiple parallel operated electron beam channels of the array optics type which are housed in a common evacuated housing and uses a common movable target stage for supporting target surfaces for each of the respective electron beam channels below the optical axes thereof and for mechanically moving all of the target surfaces within the housing simultaneously in a preprogrammed controlled manner.

A feature of the invention is the provision of a multi-channel EBAL apparatus and method of operation which employs a plurality of parallel operated electron beam channels each being of the fly's eye array optics type having an electron gun for producing an electron beam, an array lenslet assembly and associated fine deflector assembly together with a coarse deflector for selectively directing the electron beam to a desired array lenslet within the array lenslet assembly and its associated fine deflector which thereafter directs the electron beam to a desired point on a target surface. The apparatus is characterized by a common movable stage for supporting the target surfaces for all of the electron beam channels below the optical axes of the plurality of parallel operated electron beam channels and for moving the target surfaces in common relative to the array optics assembly of all the channels, and further characterized by a common vacuum enclosure housing enclosing all of the electron beam channels and the common movable target stage within a commonly evacuated space. The apparatus also further preferably includes automatic target position control means for automatically moving the common movable target stage in a preprogrammed manner whereby substantially the entire surface area of a common enlarged target member can be brought under the combined view of the array optics assemblies of all of the electron beam chanels. The enlarged target surface is the surface area of an semiconductor wafer on which a plurality of semiconductor integrated circuit chips are to be formed.

Another feature of the invention is the provision of a multi-channel EBAL apparatus and method of operation wherein each electron beam channel of the array optics type further includes an electron gun supplied by an electron gun power supply, electron beam blanking electrodes supplied by an electron beam blanker control for blanking the electron beam prior to its passage through the electron beam channel, an electron beam spot size selection optical system under the control an electron beam spot size selection control circuit for controlling the cross-sectional dimensions of the electron beams used to perform the electron beam lithography, an electron beam steering deflector assembly under the control of an electron beam steering control, a stigmator under the control of a stigmation control circuit for correcting electron beam astigmatism and a coarse deflector controlled by a coarse deflection control. Each of the array optics type electron beam channels further include a lenslet array, connected to and controlled by an array lenslet focus control, a fine deflection assembly controlled by a pattern-dependent fine deflection control for controlling fine deflection of the electron beam after passage through a selected one of the array lenslets, with a fine deflection correction control for supplying individual lenslet connections to the signals supplied by the pattern-dependent fine deflection control, a station computer and an individual channel controller for controlling operation of certain of the above-listed control components of the array optics type electron beam channels in common in conjunction with the automatic movement for the movable target stage in accordance with preprogrammed lithography processing steps and patterns and for controlling other of the control components individually as determined by the individual characteristics of the several array optics type electron beam channels.

A further feature of the invention is the provision of a multi-channel EBAL apparatus and method of operation having the above set forth features and wherein the common movable stage is selectively movable in an x-y rectilinear plane that is substantially normal to the electron beam paths of the several electron beam channels and is moved by an automatically controlled x-y translation mechanism under the control of the target position control and is mechanically coupled to the movable target stage via a flexible and vacuum tight coupling.

Still another feature of the invention is the provision of a multichannel EBAL apparatus and method of operation having the above-listed features and which further includes a lenslet stitching calibration grid formed on or near the target surface for identifying the boundaries of the field of view of the respective lenslets within each array lenslet assembly as well as the boundaries of the field of view of each lenslet assembly. Fiducial marking signal producing means are provided for deriving fudicial marking signals from the lenslet stitching calibration grid for identifying the boundaries of the field of view of the respective lenslets in each array and for each array lenslet assembly for use as desired in stitching together the combined field of view of any or all of the lenslets and any or all of the array lenslet assemblies to thereby cover a desired area of the target surface.

A still further feature of the invention is the provision of a multi-channel EBAL apparatus and method of operation having the above-listed features and further including one or more of the lenslets and/or its associated fine deflector in one of the array lenslet assemblies which may be flawed. The means for automatically moving the common movable stage also comprises means for selectively permuting a target surface on which an electron beam impinges during successive exposures of the target surface to the electron beam whereby the effect of a flawed lenslet in one of the lenslet arrays can be overcome by transposition of the area of the target surface previously under the field of view of a flawed lenslet to a new location where it is subject to the field of view of a working lenslet. For this purpose the riducial marking signal producing means produces fiducial marking signals for use in stitching together the boundary of the field of view of adjacent lenslets on the target surface and for re-registration of the target surface after permutation between the same or different electron beam exposure channels. The arrangement and method further includes mapping memory means for mapping the location of areas on a target surface which were subject to the field of view of a flawed lenslet and storing the location of the flawed lenslet subjected area of the target surface for subsequent read-out and use under conditions where the fiducial marking signals are used in the control of the electron beam following permutation of the target surface to a new location where the flawed lenslet subjected areas are subject to the field of view of a working lenslet.

Still a further feature of the invention is the provision of a multi-channel EBAL apparatus and method of operation which incorporates some or all of the above-listed features and which further includes means for mechanically moving the center axis position of at least the outer arranged electron beam channels within the common evacuated housing relative to each other in order to accommodate various periodicities of repetitive patterns without loss of efficiency.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures of the drawings are identified by the same reference characters, and wherein:

FIG. 2 is a combined schematic block diagram and schematic longitudinal sectional view of a multi-channel EBAL structure constructed according to the invention and shown in top plan view in FIG. 1;

FIGS. 3A and 3B are a schematic circuit block diagram of an overall expanded EBAL system constructed in accordance with the invention wherein a plurality of stations are employed in the system and each station is comprised by a multi-channel EBAL apparatus such as shown in FIGS. 1 and 2;

DETAILED DESCRIPTION OF PREFERRED EMBODIMENT

As noted in the preceeding description, the thru-put of an EBAL system can be increased by using multiple parallel electron beam channels of the array optics type to expose a plurality of target surfaces simultaneously. In the following description, the disclosure will be with relation to a semiconductor wafer on which it is desired to form a plurality of semiconductor integrated circuit chips by electron beam accessed lithography. For this reason, the description will be with relation to an electron-resist coated semiconductor wafer; however, it is to be expressly understood that the EBAL system herein described can be employed with other target surfaces such as ferromagnetic garnet substrates used to make bubble memories wherein it is desired to write with an electron beam particular pattern configurations into a plurality of target surfaces simultaneously to thereby increase thruput of the system with minimal cost in capital equipment.

Figure 1:
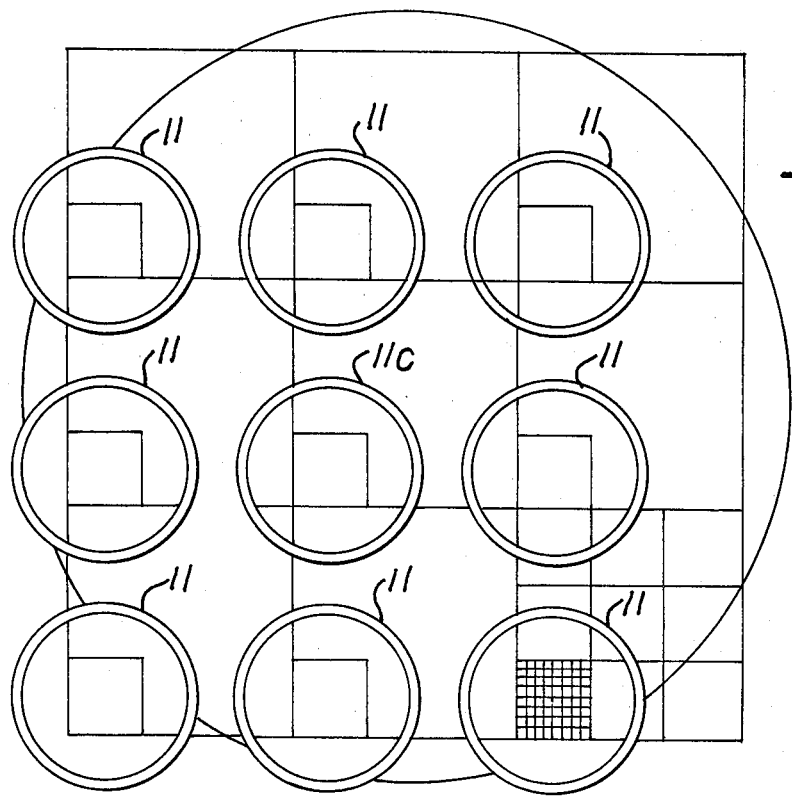
FIG. 1 is a schematic top plan view looking down on a multi-channel EBAL apparatus constructed according to the invention wherein there is provided an assembly of 3×3 electron beam channels of the array optics type and wherein each channel includes an array lens assembly having 16×16 array lens and fine deflector elements.

FIG. 1 is a top plan view of a multi-channel EBAL apparatus constructed in accordance with the invention in which nine electron beam channels of the array optics type are shown at 11. Each electron beam channel is of the array optics type with the array optics being comprised by an assembly of 16×16 array lenslets and associated fine deflector elements as shown in the lowermost right hand electron beam channel. The channels are spaced on 1.2 inch centers and the array lens and deflectors of each channel cover an area of 0.4 inches on a side. The coarse deflector for each channel has a 1 inch inside diameter.

FIG. 1 illustrates the multi-channel apparatus in connection with a 4 inch diameter semiconductor wafer on which a plurality of semiconductor integrated circuit chips are to be formed. With this arrangement, substantially 100% efficient use of the semiconductor wafer surface area can be achieved by mechanically stepping the wafer position relative to the central optical axes of the electron beam channels through a 3×3 sub-array of channel fields. By a channel field is meant the field of view of an electron beam channel when projected downwardly onto the target surface of the wafer. The manner in which the wafer is supported on a movable target stage and stepped in an x-y plane normal to the electron beam paths of the electron beam channels through the 3×3 sub-array of channel fields depicted in the lower right hand corner of FIG. 1 will be described more fully hereinafter with relation to FIG. 2 of the drawings. By thus stepping the target surface in an x-y plane under a 3×3 array of single channel fields, it will be seen in FIG. 1 that substantially the entire surface of the target semiconductor wafer will be exposed. However, because the efficiency of the corner channels is only about two thirds, the thru-put achieved with this arrangement will be approximately 9'-4/3=7⅔× that of a single electron beam channel run 9 times.

The geometry of the 4 inch semiconductor target wafer shown with the apparatus arrangement of FIG. 1 imposes some restriction on the size of chips which can efficiently use the total silicon area of the wafer. Two constraints are involved: (1) a chip might be required to span an integral number of lenslet fields, and (2) an integral number of chips must fit between the electron beam channels. Table 1 below lists the efficient chip sizes for the geometry of the structural arrangement shown in FIG. 1.

TABLE I

| 100 Percent Efficient Chip Sizes in Mils |
|---|
| 400 |
| 300 |
| 200 |
| 150 |
| 100 |
| 75 |
| 50 |
| 25 |

Figure 5C:
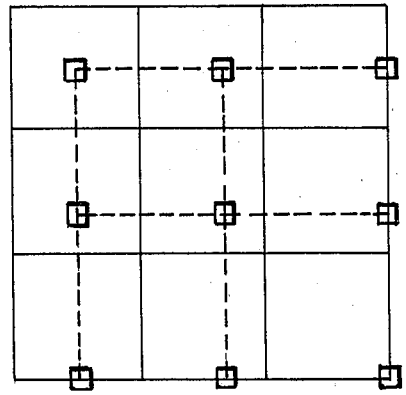
FIG. 5 is a series of schematic sketches illustrating different hypothetical situations under conditions where the target surfaces viewed by the individual electron beam channels field of view is smaller than but not commensurate with the field of view (A), the target surface exceeds the field of view of the individual electron beam channel in one dimension (B) and the target surface to be treated is larger than the field of view of the individual electron beam channels in both dimensions (C)

For chip sizes different from those listed in Table 1, because of the fixed channel spacing, some silicon area will be wasted between channels as will be described hereinafter with relation to FIG. 5 of the drawings. Further, it is possible to allow any chip size to be used at 100% efficiency of silicon usage by providing for variable channel spacing as will be described later in connection with FIG. 6. However, for the present purposes it will be assumed that the structural arrangement shown in FIG. 1 employs fixed channel spacing between the electron beam channels and that the chip size being fabricated is one of those listed in Table I.

FIG. 2 is a combined schematic longitudinal sectional view of a multi-channel electron beam accessed lithography (EBAL) apparatus constructed according to the invention and functional block electric circuit diagram illustrating the essential control circuits used in conjunction with the apparatus. In FIG. 2, three of the array optics type electron beam channels are shown side by side, with only one of the channels being illustrated in detail. It should be noted that a sectional view taken through the apparatus in a plane which would be at right angles to the plane of the apparatus as shown in FIG. 2 would illustrate a similar three channel assembly such that the overall apparatus is comprised of 3×3 or 9 electron beam channels all similarly constructed. The coarse deflector of the array optics electron beam channel of FIG. 2 is shown at 11 and would correspond to one of the circular elements 11 shown in the top plan view of FIG. 1. The 3×3 array of electron beam channels are supported within a common evacuated housing 12 by suitable mechanical supports not shown in FIG. 2. Each of the nine array optics type electron beam channels include an electron gun comprised by a cathode 13, first and second control grids 14A and 14B and first and second anodes 15A and 15B. The electron gun (hereinafter referred to as 13) produces an electron beam whose path is indicated at 16 which first passes through a set of blanking electrodes 17, a first imaged aperture 18a, a lens assembly 18b, a set of spot selection electrodes 19, a second lens assembly 21, a second imaged aperture 21b, and thence to a set of steering and stigmation control electrodes 22. After passing through the steering and stigmation electrodes 22, the electron beam enters the coarse deflector assembly 11 which may be constructed and operated in the manner described in U.S. Pat. No. 4,142,132, issued Feb. 27, 1979, entitled "Method and Means for Dynamic Correction of Electrostatic Deflector for an Electron Beam Tube", Kenneth J. Harte—inventor and assigned to Control Data Corporation. Preferably, however, the coarse deflector 11 is constructed in the manner described in U.S. patent application Ser. No. 093,008 filed Nov. 9, 1979, entitled "Improvements to Eight-Fold Deflector", Kenneth J. Harte and Edward C. Dougherty—inventors, and assigned to Control Data Corporation. From the coarse deflector 11, the electron beam then enters a selected lenslet of an array lenslet assembly shown generally at 23 which it passes through to enter an associated fine deflector element 24 which then deflects the electron beam to a desired point on a target surface supported on a movable target stage 25. The array lenslet assembly 23 and fine deflector assembly 24 are preferably of the type described in U.S. Pat. No. 4,200,794 issued Apr. 29, 1980 for a "Micro Lens Array an Micro Deflector Assembly for Fly's Eye Electron Beam Tubes Using Silicon Components and Techniques of Fabrication and Assembly"—Sterling P. Newberry and John R. Burgess, inventors, assigned to the Control Data Corporation. The disclosures of U.S. Pat. No. 4,142,132; U.S. Pat. No. 4,200,794 and U.S. patent application Ser. No. 093,008 are hereby incorporated into the disclosure of this application in their entirety.

The movable stage 25 is designed to support a target surface such as a semiconductor wafer below the fields of view of the 3×3 assembly of electron beam channels 11 as depicted in FIG. 1. FIG. 1 shows the assembly designed for optimum use with a 4 inch diameter semiconductor wafer. It is to be expressly understood that the invention is in no way limited to the use of 4 inch diameter wafers but could be used with 5 inch, or 6 inch or any other size wafer by appropriate choice of number of and spacing between the electron beam channels. The spacing between channels would of course be such as to optimize efficient use of the semiconductor wafer surface. The semiconductor wafer target surface 40 is supported on the target stage 25 which is movably positioned within the evacuated housing 12 beneath the field of view of the 3×3 assembly of electron beam channels. Target stage 25 is mechanically coupled to an x-y stage translation mechanism 26 of conventional, commercially available construction through a vacuum type flexible coupling indicated at 27. The x-y stage translation mechanism 26 in turn is electrically controlled by a movable stage position control circuit 28 that in turn comes under the control of a station computer 29. The station computer 29 can be preprogrammed to cause control 28 to have the x-y stage translation mechanism 26 controllably step the target stage 25 alone either the x or y axis of a plane that is normal to the plane of the FIG. 2 drawing and substantially normal to the electron beam paths of the electron beam channels. In this manner, the stage 25 can be caused to move the enlarged target wafer as shown in FIG. 1 either right or left or in or out so as to move the 3×3 sub-array of channel fields selectively beneath all of the electron beam channels simultaneously. In the position shown in FIG. 1, the channel field of the 9 electron beam channels corresponding to the field which is shown in cross hatch to illustrate the 16×16 array lenslet and deflector fields of view, would be centered under the respective electron beam channels in the manner shown. Thereafter, in a preprogrammed manner, the target semiconductor wafer would be moved by movable stage 25 for a distance corresponding to the center to center spacing of the 3×3 sub-array of channel fields so as to bring, for example, the next channel field to the right of those illustrated beneath the field of view of the respective electron beam channels. Thereafter, in a preprogrammed controllable manner, the wafer would be stepped through all of the 3×3 sub-array of channel fields by the station computer 29 via control 28 and the x-y stage translation mechanism 26, the flexible vacuum tight coupling 27 and movable stage 25 in accordance with preprogrammed lithography processing steps and patterns so as to cover substantially the entire surface area of the target semiconductor wafer by the combined fields of view of all of the parallel operated electron beam channels used in conjunction with the mechanical stepping of the target wafer sufaces.

Each of the 3×3 assembly of EBAL optical channels shown in FIG. 2 should employ a cathode which combines adequate brightness and low operating temperature with long life in a demountable vacuum chamber which may be occassionally exposed to room air. Furthermore, the cathode should be designed for periodic replacement in demountable hardware. One suitable cathode would be tungsten having a brightness of approximately $3 \times 10^4$ amperes per square centimeter per sterradian. An even better choice having higher brightness would be a lanthanum hexaboride cathode which could operate the EBAL optical column at a brightness of about $4 \times 10^5$ amperes per square centimeter per sterradian. A still further possible cathode, as will be discussed hereinafter with relation to FIG. 4, would be a field emission cathode as opposed to the two thermal cathodes described above.

Electrical power for the cathode and electron gun of each of the EBAL optical channels is supplied from a high voltage and cathode power supply 31 shown in FIG. 2 of the drawings. The beam blanker electrodes 17 are supplied from an electron beam blanker control 32, the lens assembly 18b as well as 21a are also supplied from the high voltage power supply 31 and the beam spot size and shape selection electrode 19 is under the control of a spot selection control circuit 33. The steering and stigmation elecrodes 22 are controlled by a steering and stigmation control circuit 34 and the coarse deflector 11 is under the control of a coarse deflector control 35.

Looking at the lower portion of FIG. 2 it will be seen that the array lenslets are under the control of a channel array lens control circuit 36, the fine deflection elements under the control of associated fine deflection correction circuit 37 as well as a pattern dependent fine deflection control circuit 38 shown on the right hand side of FIG. 2. The fiducial signal processing circuits for each of the EBAL channels are shown at 39, and lastly a flawed lenslet pattern memory circuit 41 which works in conjunction with station computer 29 and controllers 30.

All of the above-listed electron beam channel components and their control circuits are well known in the art and have been described in prior publications and patents such as the above-referenced U.S. Pat. Nos. 4,200,794; 4,142,132 and U.S. application Ser. No. 254,870. For this reason, a detailed description of each of the components and its manner of operation as well as the construction and operation of its related control circuit or component, is not believed to be required. It should be noted with respect to FIG. 2, however, that certain of the control and supply circuits shown on the right hand side of FIG. 2 are common to all of the array lenslet type electron beam channels. These are comprised by the high voltage and cathode power supply 31, the spot selection control circuit 33, the coarse deflection control circuit 35, the flawed lenslet pattern memory 41, the station computer 29, the pattern dependent fine control circuit 38 and the movable stage position control circuit 28. The control circuits shown on the left hand side of FIG. 2 are independently controlled by the individual channel controllers 30 for operation in conformance with the operating characteristics of each of the individual electron beam channels. These are comprised by the blanker control circuits 32, of course the individual channel controllers 30, the steering and stigmation control 34, the array lens control 36, the fine deflection correction 37 and the fiducial signal processing circuits 39.

The method of achieving lenslet stitching and multi-level pattern registration by mapping a lenslet stitching calibration grid onto a workpiece of semiconductor wafer or chip to be processed in the EBAL apparatus, is described more fully in copending U.S. application Ser. No. 254,870, and reference is made to the disclosure of that application for a full description of the techniques and procedures employed in achieving required pattern registration and lenslet stitching as described in that application. Briefly, however, a chip registration grid is defined by first producing fiducial marks at the corners of each integrated circuit chip in the manner described in copending application Ser. No. 254,870. Then, by measurement of the position of the fiducial marks, a transformation can be computed in a computer which will in turn map the chip registration grid into a lenslet stitching calibration grid by means of which patterns are actually written on the target surface. With this method, chip by chip corrections can be made for semiconductor wafer insertion errors (translation or rotation) and wafer dimensional changes due to expansion or quadrilateral distortion. Prior to placing an EBAL apparatus according to the invention in operation, it is necessary first to form the lenslet stitching calibration and chip registration grids as described briefly above.

The next problem which has to be considered in the subject apparatus is any inaccuracy in lenslet stitching and the pattern registration which can occur due to the non-orthogonal angle which the electron beams make at the target surface due to the fact that exposure to the electron beams is made on the surface of workpieces which are not inserted at exactly the same height (distance from the electron source) as the original lenslet stitching calibration grid. This problem is explained more fully in the above-noted copending U.S. application Ser. No. 254,870, and reference is made to that application for a more detailed description of the problem and the manner in which it is overcome by appropriate correction based on a triangulation method of height measurement.

Another problem which must be considered in any practical apparatus, is the occurrence of one or more flawed lenslets in any one of the lenslet arrays employed in any one of the plurality of electron beam channels. Since the failure of any lenslet in any one of the lenslet arrays would result in the production of a bad integrated circuit chip, the chip yield would be reduced substantially if means were not provided for overcoming the existence of any such flawed lenslets. The flawed lenslet problem can be solved by permuting a semiconductor target wafer between two positions in a manner such that any portion of a target surface which previously had been exposed to the field of view of a flawed lenslet, is selectively and in a program controlled manner permuted to a new position where it is subjected to the field of view of a good lenslet and the target then subsequently exposed to the electron beam in accordance with the pattern movement of the beam required for that particular area of the target. The manner in which permutation of the target wafers between two positions to correct for the existence of any flawed lenslets again is described more fully in the above-referenced copending U.S. application Ser. No. 254,870, and reference is made to that application for a full description of the techniques required.

Prior to placing an EBAL apparatus according to the invention in operation, it is first necessary to form appropriate lenslet stitching calibration grids for each individual electron beam channel in the EBAL apparatus as taught in application Ser. No. 254,870. After insertion of a target wafer on the movable head, chip registration grids could be formed on the surface of the wafer along the boundaries of each integrated circuit chip site in the manner taught by application Ser. No. 254,870.

In operation, after positioning of the target wafer surface in a preprogrammed manner by the movable stage 25, the electron beams produced by the electron gun of each of the 9 array optics type electron beam channels first passes through the set of blanking electrodes 17 which are positioned to deflect the electron beam off an aperture and onto an opaque plate for cutting off or blanking the beam of each channel before it reaches the target surface. When the preprogramming calls for electron writing on the target surface, blanking is discontinued, and the individual electron beams are allowed to pass through the beam spot selection optical system 18a and b, 19, 21a and b, for establishing the size and shape of the electron beam spot. The beam then passes through the beam stigmator and steering deflector 22 for stigmating the electron beam and aligning the beam with the axis of the coarse deflector 11, which in turn deflects the beam 16 to the entrance of a particular lenslet in the array lenslet assembly 23. Because the coarse deflection systems 11 of all of the electron beam channels are under the common control of the coarse deflection control circuit 35, the electron beams of all of the electron beam channels will be deflected to corresponding ones of an array lenslet in the array lenslet assemblies. After passing through the array lenslet, the electron beams will pass through corresponding associated ones of the fine deflectors which likewise are under the common control of the pattern dependent fine deflection control circuit 38. As a result, the electron beams will be caused to write upon corresponding surfaces of the target semiconductor wafer simultaneously. Referring again to FIG. 1, if it is assumed that the $16 \times 16$ array lenslet and fine deflector assemblies have a sufficient field of view to cover entirely one semiconductor integrated circuit chip, it will be seen that by the above described EBAL apparatus and method of operation, nine semiconductor integrated circuit chips can be treated simultaneously as opposed to a single beam system as described in copending application Ser. No. 254,870.

The thruput of the multiple channel EBAL apparatus shown and described with relation to FIGS. 1 and 2 is determined primarily by four factors: exposure time, the time required for deflection between lenslets and between the various patterns to be written, the time required for various mechanical motions of the wafers which is being written, and the time required to measure the positions of the chip pattern registration marks. Table 4—1 lists these times for a representative nine-channel EBAL station designed to expose patterns having 0.5 $\mu$m smallest features, at a rate of 50 four-inch wafers per hour.

TABLE 4-1

Tabulation of Time Elements Which Determine Thruput for a Representative EBAL Station Designed to Write 0.5 $\mu$m Features at a Rate of 50 Four Inch Wafers Per Hour.

|  | Time (Seconds) |
|---|---|
| Exposure | |
| 10% coverage with 0.5 $\mu$m smallest feature | 30 |
| 30% coverage with 3x smallest feature | 10 |
| Deflection | |
| Lenslet selection (coarse deflection) | 0 (0.1) |
| Lenslet subfield selection | 5 |
| Pattern feature selection | 10 |
| Mechanical | |
| Wafer transport and initial positioning | 10 |
| Wafer exposure stepping (9 positions) | 5 |
| Calibration | |
| Chip pattern registration marks | 2 |
| | 72 |

For a given wafer size and smallest feature to be written, the exposure time and the stepping rate are related by general geometrical considerations. These relations are summarized in the nomograph of FIG. 4. The data in FIG. 4 assumes 10% coverage by the smallest feature; additional coverage by larger features require additional time not accounted for in this nomograph. As an example of the use of FIG. 4 consider a smallest feature of 0.5 $\mu$m and an exposure time of 0.5 minute then the stepping rate must be approximately 140 MHz.

The performance boundaries of various EBAL systems is then given by the heavy lines T-1C, T-9C, FE-1C and FE-9C, where T, FE and C refer to thermal, field emitter and channel, respectively. Then boundaries are calculated under the assumption of a resist sensitivity of 5 $\mu$C/cm$^2$, gun brightnesses of $4 \times 10^5$ amp/cm$^2$—sr for thermal LaB$_6$ and $2 \times 10^8$ amp/cm$^2$—sr for field emitting W/Zr, and 4x increase in current density by using a stigmator, 22 in FIG. 2, to correct astigmatism due to fine deflection.

Figure 4:
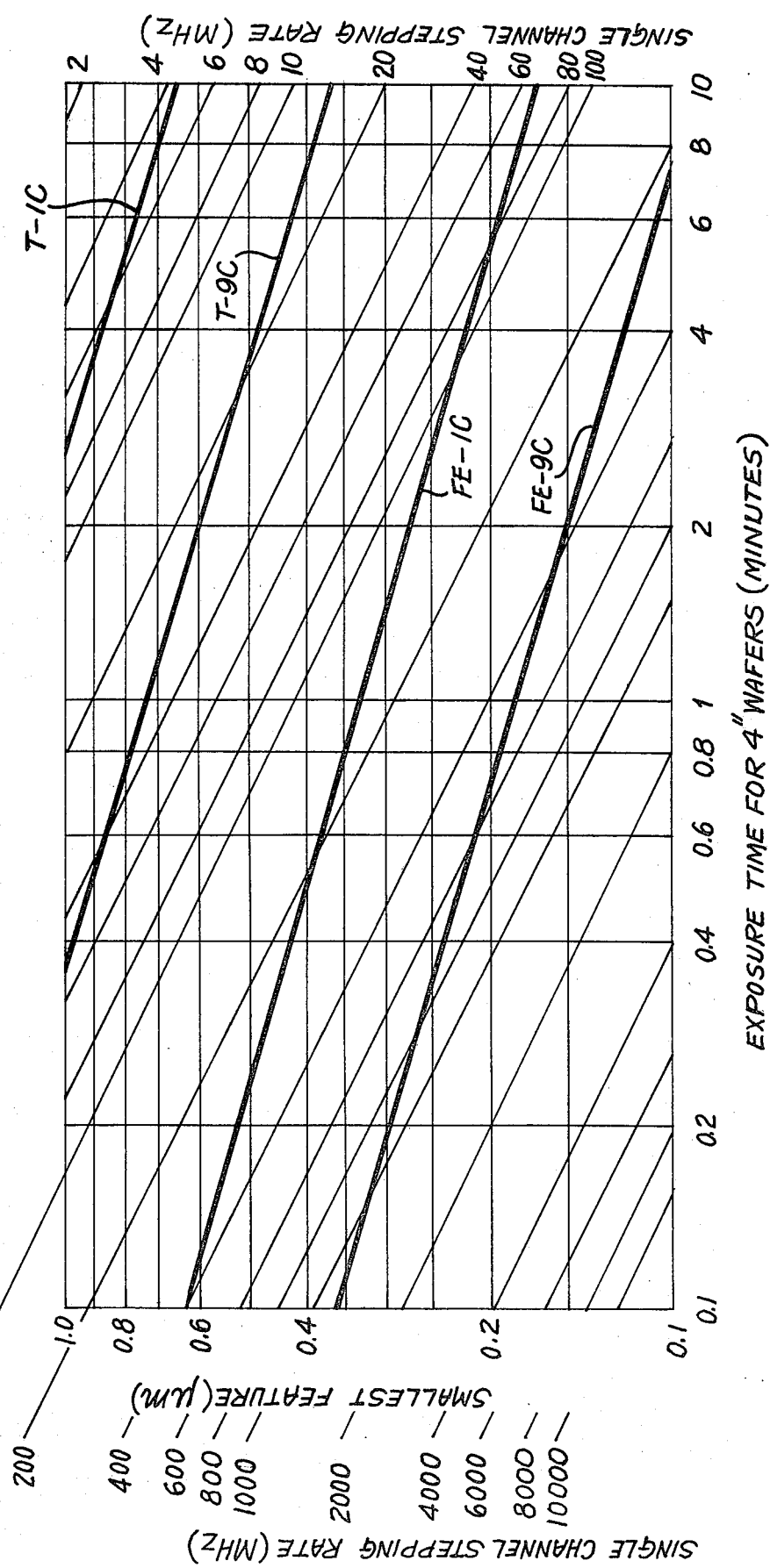
FIG. 4 is a characteristic graph illustrating the relationship between certain operating parameters of the apparatus and method such as the relationship between the smallest feature on the target surface to be treated, exposure time, and stepping rate for different types of electron emission cathodes used in the electron gun of the array optics type electron beam channels.

The operating region of FIG. 4 for a single array optics channel using a thermal cathode (LaB$_6$) lies above and to the right of the heavy line labeled T-1C. These lines are based upon optimal designs of einzellens array optical systems. It is clear that systems of present day economic interest cannot be built in this way. This suggests that an array of EBAL channels be used as has been shown in FIG. 1. In this case a 3×3 array of EBAL channels is positioned over a four-inch wafer. The array size is chosen such that the entire wafer can be exposed by stepping the wafer to cover the 3×3 array of channel fields. The performance boundary of this 3×3 array is shown by the line labeled T-9C in FIG. 4. The nine-channel system T-9C is obtained by shifting the T-1C line to shorter exposure time by a factor of $9-4/3 = 7\frac{2}{3}$(not nine because the corner channels are not 100% efficient).

The field emission cathode system, FE-1C and FE-9C, are obtained approximately by shifting the corresponding thermal lines T-1C and T-9C to shorter exposure times by the ratio of cathode brightnesses for field emission and thermal cathodes, i.e., $2 \times 10^8 / 4 \times 10^5 = 500$. Actually the FE-1C and FE-9C lines have been shifted by only a factor of 100 in order to account for the loss in effective brightness due to aberration of the required magnifying optics. Furthermore, with these cathodes, stepping rate becomes more of a technical limit than brightness. As an example, consider a 0.5 μm smallest feature and an exposure time of thirty seconds. Then from FIG. 4 an FE-1C system requires stepping at 140 MHz. however, for 9 FE channels this falls in the more realistic range of 18 MHz. As a result of this discussion it is seen to be reasonable to enter thirty seconds in Table 4—1 for the exposure time of 0.5 μm features covering 10% of a four-inch wafer. The time for exposure of 30% of the wafer with a 3× larger feature is obtained by assuming that the spot selection system, consisting of the elements 18A, 18B, 19, 21A and 21B in FIG. 2, is employed to select a spot 3× larger in diameter than the smallest feature without change in current density, which in this case would be $3 \times 0.5 = 1.5$ μm. Then the exposure time for 30% coverage by this larger feature is given by $3 \times (1/9) \times 30 = 10$ seconds which time has been entered in Table 4—1.

Returning to Table 4-1 three deflection times have been identified. The first to be considered is the time to deflect the beam from one lenslet to another. In the system under discussion there are 9×9 lenslets in each channel and 9 wafer positions under each channel for a total of $9 \times 9 \times 9 = 729$ coarse deflection steps. With the present state-of-the-art in electronics each coarse deflection step can easily be made in $10^{-4}$ seconds so that $729 \times 10^{-4} \simeq 0.1$ second is required for this deflection time. This is essentially zero as far as the other entries in Table 4-1 are concerned.

The lenslet subfield selection time arises for the following reason. A practical fine deflection system must consist of two levels, a high-voltage (100 volts) slow-speed ($\simeq$100 kHz) level, which selects one of an array of subfields (e.g., 32×32) within a lenslet field, and a low-voltage ($\simeq$3 volt) high-speed ($\simeq$16 MHz) level, which is used to write pattern features within each subfield. Given the present state-of-the-art in electronics and the number of lenslet subfields it is estimated that 5 seconds are required for subfield deflection, and this time has been entered in Table 4-1.

Finally, the time required to deflect the electron beam from feature-to-feature within a lenslet subfield has also been estimated and a time of 10 seconds is entered in Table 4-1.

Turning now to the question of the time required for mechanical motion, two different types of motion can be identified. The first is the time to transport a wafer under the EBAL optics, and the second is the wafer stepping time during exposure (minimum of 9 steps). The transport time from atmospheric pressure to vacuum can be made essentially zero by the use of a cassette and air-lock system. Prior to placement of the wafer under the EBAL optics the wafer can be brought to a parking position within the vacuum only a few inches from the final exposure position. Hence 10 seconds is ample time to allot for the final placement of the wafer in the exposure stage, particularly since placement needs to be accurate only to within 1-3 mils due to the wide latitude in the capture range of the electronic signal producing fiducial system.

Wafer stepping between exposure positions needs to be accomplished in a few tenths of a second in order to be a small part of the total thruput time. It is clear that a linear electronic motor, commonly called a voice coil, is quite capable of performing such stepping even for stages which weigh 10 to 20 pounds. Hence it is reasonable to enter 5 seconds in Table 4-1 for this mechanical operation.

Finally, the time for measurement of the pattern registration grid which is on the wafer which is being exposed must be taken into account. Two seconds is estimated to be much more than is necessary but in order to make the total time 72 seconds corresponding to 50 wafers/hour, 2 seconds has been entered in Table 4-1 for this chip pattern retistration grid fiducial calibration measurement.

It is technically possible and economically advantageous to increase the thruput of an EBAL installation by using multiple station wherein each station comprises a multiple channel EBAL apparatus of the type shown in FIGS. 1 and 2 of the drawings, and wherein all of the stations are operated in parallel under the supervision of a system executive computer. The economic advantage of such multiple, multi-channel EBAL station increased capacity system results from a significant sharing of the vacuum systems, the transport system for the target wafers and the electronic hardware as shown in FIGS. 3A and 3B of the drawings. In FIGS. 3A and 3B, a multi-station system is shown wherein there are from 1 to N stations where N is a number determined by the desired thru-put (productivity) of the overall system installation. Each station has from 1 to M channels where M depends on the size of the wafer to be exposed. If the station is to have 9 channels as was described for 4 or 5 inch wafers in FIGS. 1 and 2, then the number M would equal 9 and there would be a number of N stations each having M=9 channels in the overall system. Similar to the FIG. 2 apparatus, each channel of the system will have its individual blanker control circuit 32, steering and stigmation control circuit 34, array lens control circuit 36, fine deflection correction circuit 37, and fiducial signal processing circuit 39 all interconnected with and controlled by or helping to control the individual channel controller 30. Further, each electron beam channel such as number one also will have supplied to it control signals from a spot selection control circuit 33, a coarse deflection control circuit 35, a pattern dependent fine deflection circuit 38 and a flawed lenslet pattern memory 41 all of which control circuits are shared in common through the station computer 29 with other electron beam channels in the station. Since all stations would be fabricated in the same manner, a description of other channels in station one or for that matter description of the other stations is deemed unnecessary.

In order to coordinate operation of all of the multi stations, the station computers of all of the stations are under the control of a master system executive computer 44 which serves all of the stations. It is assumed that all of the stations in the system installation will be fabricating a mass produced semiconductor integrated circuit chip hence a master complete pattern memory 42 can be provided at the system executive computer 44 for controlling all of the stations which in turn control all of the electron beam channels. This also makes it possible for the system installation to have a single master movable stage control 28 and a single master high voltage and cathode power supply circuit 31 supplying all of the channels of all of the stations to thereby economize on the hardware required in the overall system installation.

Where using EBAL systems and apparatus of the type shown and described with relation to FIGS. 1-4, certain natural semiconductor integrated circuit chip sizes will be the most productive to manufacture due to the discrete spacing of the lenslets within the array lenslet assembly of each electron beam channel, the limited size of the electron beam channel fields of view, and the discrete spacing between the electron beam channels. Thus, it is most convenient to employ the apparatus system and method of manufacture in connection with integrated circuit chip dimensions which are equal to an integral number of lenslets, because then the control programs for each lenslet would be the same for all chips. In practice this should not represent a serious disadvantage since the spacing between lenslets will typically be approximately 0.024 inches and typical modern chips are of the order of 0.200 inches on a side.

A second natural integrated circuit chip size which would be convenient would be to make the chip size commensurate with the size of the field of view of the electron beam channels, i.e., an integral number of chips fit within a channel field. This constraint results in the minimum number of mechanical steps for the movable target stage. Examples of various other relationships between the integrated circuit chip size and the size of the fields of view of the electron beam channels are illustrated in FIG. 5.

In FIG. 5 chips which are smaller than but not commensurate with the channel fields are illustrated. In this situation, the fiducial marks required to derive the fiducial marking signals would be at the corners of the chips and 4×4 instead of 3×3 mechanical movement steps of the stage are required to write the wafer. Thus, chips which are smaller than the size of the channel field can be written at the expense of more mechanical movement of the movable target stage.

Figure 5B:
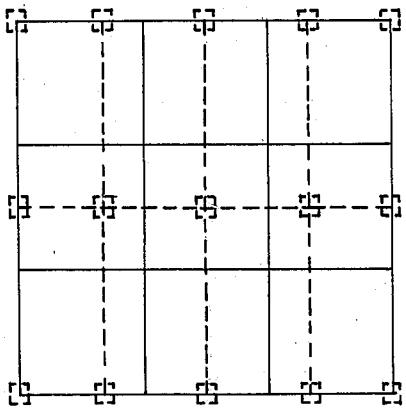
Figure 5A:
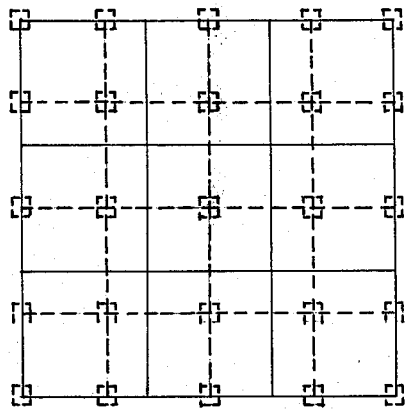

FIG. 5B illustrates a situation wherein the semiconductor integrated circuit chip size exceeds the size of the field of view of the channels in one dimension only. In this situation the fiducial marks are chosen such that only 3×3 mechanical steps are required along the long dimension but more steps are required along the short dimension similar to the FIG. 5A situation. Another requirement is that placement of additional fiducial marks along the edges of the chip would be required.

FIG. 5C illustrates a situation where the integrated circuit chips are larger than the channel field of view in both dimensions. In this situation it may be possible to write the wafer with only 3×3 movement; however, the wafer can only be written by placing additional fiducial marks within the working area of the chips.

Finally, it will be appreciated that natural chip sizes arise from the mechanical constraints of the apparatus and system whereby it is most desirable that an integral number of integrated circuit chips fit between the electron beam channels. As a result, for certain chip sizes, this constraint imposes less than 100% utilization of the silicon wafer surface area. For the particular preferred multi-channel EBAL system described in this application, the 100% efficient chip sizes are listed in Table I.

Figure 6:
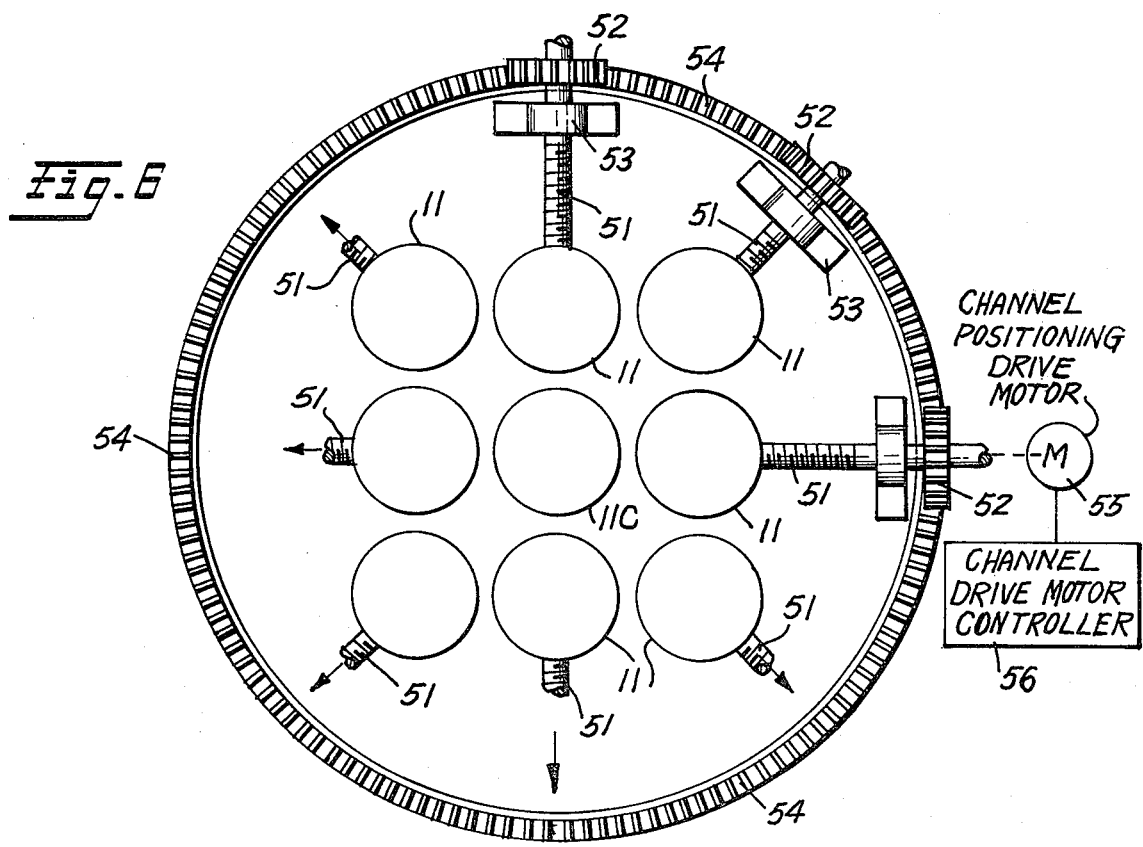
FIG. 6 is a top plan view of an alternative structure according to the invention wherein the center optical axes of the outer arranged electron beam channels can be mechanically moved relative to each other to accommodate different various periodicities of repetitive patterns at 100% efficiency.

If it is desired to obtain a full 100% silicon wafer surface utilization for integrated circuit chips which are not commensurate with the channel spacing this can be achieved by providing a small mechanical adjustment between the electron beam channel spacing in the manner shown in FIG. 6 of the drawings. With the arrangement shown in FIG. 6, a channel spacing adjustment of only 0.150 inches would be sufficient to make all chip sizes which are smaller than or equal to the field size of the array 100% efficient in silicon wafer surface utilization. Because this adjustment as illustrated in FIG. 6 does not require great mechanical precision and can be done slowly and rarely whenever adapting the installation to a new and different size integrated circuit chip size, there is no practical difficulty encountered in providing such additional flexibility provided the need for such flexibility is economically justified.

In FIG. 6, the outer electron beam channels 11 surrounding the center channel 11C are moved in and out radially from a common center position by means of lead screws shown in 51 which are simultaneously turned by means of a rack and pinion arrangement shown at 52 supported on suitable bearing blocks 53. All of the pinions 52 and hence lead screws 51 are moved simultaneously by rotating the ring-shaped rack 54 through the column positioning drive motor 55 under the control of a column drive motor controller 56. The column drive motor controller 56 in the system of FIG. 6 would be included along with the common station controls in the system of FIG. 2 or FIGS. 3A and 3B. By properly designing the pitch of the lead screws 51, the electron beam channels can be moved in and out so as to maintain a regular rectangular array while providing variable spacing between the centers of the columns. In the case of larger than 3×3 multi-channel systems, where there would be radially aligned electron beam channels that would have to be moved, a differential screw arrangement would be required in order to provide the required channel position movement. The accuracy required of the movement mechanism is determined by the electronic capture range of the fiducial marking signal deriving system which is known to be in the order of 1 to 3 mils. Also, it should be noted that the required column position motion does not occur very often (only when it is necessary to adapt the installation to a new and different size integrated circuit chip), and thus the column position movement can be effected at slow speeds.

With a multi-channel EBAL system such as shown in FIG. 6 where the electron beam column positions can be moved, let the parameters of the system be defined as follows:

```
s  = lenslet spacing
m  = lenslets per chip side
n  = chips between channels
mn = lenslets between channels
w  = chip size
   = s × m mils
```

For an apparatus where the lenslet spacing s=0.025, all m between 1 and 12 (maximum chip size of 300 mils) and n such that mn is as close to 48 as possible, the results shown in Table II can be obtained. From Table II, it will be seen that all integrated circuit chips between the sizes of 25 and 300 mils on a side can be processed in increments of 25 mils with 100% efficiency of silicon surface utilization if the electron beam channel spacing is varied over a range of 50−44=6 lenslets or a distance of 6×25=150 mils.

TABLE II

| m | n | mn | w (mils) |
|---|---|----|----------|
| 1 | 48 | 48 | 25 |
| 2 | 24 | 48 | 50 |
| 3 | 16 | 48 | 75 |
| 4 | 12 | 48 | 100 |
| 5 | 9 | 45 | 125 |
| 6 | 8 | 48 | 150 |
| 7 | 7 | 49 | 175 |
| 8 | 6 | 48 | 200 |
| 9 | 5 | 45 | 225 |
| 10 | 5 | 50 | 250 |
| 11 | 4 | 44 | 275 |
| 12 | 4 | 48 | 300 |

From the foregoing description, it will be appreciated that the invention provides a new and improved EBAL system and method of operation which employs multiple, parallel operated electron beam channels of the array optics type having an electron gun for producing an electron beam, an array lenslet assembly and associated fine deflector assembly together with a coarse deflector for selectively directing the electron beam to a desired array lenslet within the array lenslet assembly and its associated fine deflector which thereafter directs the electron beam to a desired point on a target surface. The apparatus is characterized by a common movable stage for supporting the target surfaces for all the electron beam channels below the optical axis of the plurality of parallel operated electron beam channels and for moving the target surfaces in common relative to the array optics assemblies of all the channels. It is further characterized by a commonly evacuated space. An automatic target position control means is provided for automatically moving the common movable target stage in a preprogrammed manner whereby substantially the entire surface area of a common enlarged target member can be brought under the combined view of the array optics assemblies of all the electron beam channels. In its primary intended function, the apparatus and method are employed in conjunction with a semiconductor wafer on which a plurality of semiconductor integrated circuit chips are to be formed by electron beam accessed lithography.

The apparatus and method of the invention include a station computer and an individual channel controller for controlling operation of certain of the array optics type electron beam channels in common conjunction with the automatic movement of the movable target stage in accordance with preprogrammed lithography processing steps and patterns and for controlling other of the control components individually as determined by the individual characteristics of the several array optics type electron beam channels.

In a preferred form of the multi-channel EBAL apparatus and method of operation the common movable stage is selectively movable in a x-y rectilinear plane that is substantially normal to the electron beam paths of the several electron beam channels and is moved by an automatically controlled x-y translation mechanism under the control of the target position control and is mechanically coupled to the movable target stage via a flexible and vacuum-tight coupling.

The multi-channel EBAL apparatus and method of operation having the above-listed features further preferably includes a lenslet stitching grid formed on a special lenslet stitching target surface for stitching patterns across the boundaries of the field of view of the respective lenslet within each array lenslet assembly. Fiducial marking signal producing means are provided for deriving fiducial marking signals from the lenslet stitching grid for use in stitching together the combined field of view of all the lenslets.

Preferred forms of the multi-channel EBAL apparatus and method of operation also further include provisions for one or more of the lenslets and/or its associated fine deflector in one of the array lenslet assemblies being flawed. For this purpose the means for automatically moving the common movable stage also comprises means for selectively permuting a target surface on which an electron beam impinges during successive exposures of the target surface of the electron beam whereby the effect of a flawed lenslet in one of the lenslet arrays can be overcome by transposition of the area of the target surface previously under the field of view of a flawed lenslet to a new location where it is subject to the field of view of a working lenslet.

In an alternative form of multi-channel EBAL apparatus and method of operation according to the invention and which incorporates the above-listed features, an additional means is provided for mechanically moving the center axis position of at least the outer arranged electron beam channels within the common evacuated housing relative to each other in order to accommocate periodicities of repetitive patterns without loss of efficiency, such as different size semiconductor integrated circuit chips.

Having described two different embodiments of the new and improved multi-channel EBAL apparatus and method of operation according to the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A multi-channel electron beam array lithography (EBAL) apparatus employing a plurality of parallel operated electron beam channels each being of the fly's eye type having an electron gun for producing an electron beam, an array lenslet assembly and associated fine deflector assembly together with a coarse deflector for selectively directing the electron beam to a desired array lenslet within the array lenslet assembly and its associated fine deflector which thereafter directs the electron beam to a desired point on a target surface, a common movable stage for supporting target surfaces below the plurality of parallel operated electron beam channels and for moving the target surfaces in common relative to the array optics assembly of all channels, and a common vacuum enclosure housing enclosing all of said electron beam channels within a commonly evacuated space.

2. A multi-channel EBAL apparatus according to claim 1 further including target position control means for automatically moving said common movable stage in a preprogrammed manner whereby substantially the entire surface area of a common target member can be brought under the combined view of the array optics assemblies of all of the electron beam channels.

3. A multi-channel EBAL apparatus according to claim 2 wherein each electron beam channel of the fly's eye type further includes an electron gun disposed within the channel supplied by an electron gun power supply, electron beam blanking electrodes supplied by an electron beam blanker control for blanking the electron beam prior to its passage through the channel, an electron beam spot size selection optical system under the control of an electron beam spot size selection control for controlling the cross-sectional dimensions of the electron beam used to perform electron beam lithography, an electron beam steering deflector assembly under the control of an electron beam steering control, a stigmator under the control of a stigmation control for correcting electron beam astigmatism and a coarse deflector connected to and controlled by a course deflection control; each of said fly's eye type electron beam channels further including a lenslet array, connected to and controlled by an array lenslet focus control, a fine deflector assembly connected to and controlled by a fine deflection control for controlling fine deflection of the electron beam after passage through a selected one of the array lenslets, a fine deflection correction control, a station computer and an individual channel controller for controlling operation of certain of the above-listed control components of the fly's eye type electron beam channels in common in conjunction with the automatic movement means for the movable stage in accordance with preprogrammed lithography processing steps and patterns and for controlling other of the control components individually as determined by the individual characteristics of the several electron beam channels.

4. A mutli-channel EBAL apparatus according to claim 3 wherein the common movable stage is selectively movable in an x-y plane that is substantially normal to the electron beam paths of the several electron beam channels by an automatically controlled x-y translation mechanism under the control of said target position control means and mechanically coupled to the movable stage via a flexible and vacuum tight coupling whereby substantially the entire surface area of the target surface can be brought under the combined fields of view of a plurality of parallel operated electron beam channels.

5. A multi-channel EBAL apparatus according to either of claims 1-4 wherein the target surface is the surface of an semiconductor wafer on which a plurality of semiconductor integrated circuit chips are to be formed.

6. A high capacity, high thru-put EBAL apparatus comprised of a plurality of multi-channel EBAL stations each comprised of apparatus constructed according to either claim 3 or 4 and further including a system executive computer for controlling operation of the several station computers in the system.

7. A multi-channel EBAL apparatus according to claim 1 further including a lenslet stitching calibration grid formed on or near the target surface for identifying the boundaries of the field of view of the respective lenslets within each array lenslet assembly as well as the boundaries of the field of view of each array lenslet assembly, fiducial marking signal producing means for deriving fiducial marking signals from said lenslet stitching calibration grid for identifying the boundaries of the field of view of the respective lenslets in each array and for each array lenslet assembly for use as desired in stitching together the combined field of view of any or all the lenslets and any or all the array lenslet assemblies to thereby cover a desired area of the target surface.

8. A mutli-channel EBAL apparatus according to claim 7 further including target position control means for automatically moving said common movable stage in a preprogrammed manner whereby substantially the entire surface area of a common target member can be brought under the combined view of the array optics assemblies of all of the electron beam channels.

9. A multi-channel EBAL apparatus according to claim 8 wherein each electron beam channel of the fly's eye type further includes an electron gun disposed within the channel supplied by an electron gun power supply, electron beam blanking electrodes supplied by an electron beam blanker control for blanking the electron beam prior to its passage through the channel, an electron beam spot size selection optical system under the control of an electron beam spot size selection control for controlling the cross-sectional dimensions of the electron beam used to perform electron beam lithography, an electron beam steering deflector assembly under the control of an electron beam steering control, a stigmator under the control of a stigmation control for correcting electron beam astigmatism and a coarse deflector connected to and controlled by a coarse deflection control; each of said fly's eye type electron beam channels further including a lenslet array, connected to and controlled by an array lenslet focus control, a fine deflector assembly connected to and controlled by a fine deflection control for controlling fine deflection of the electron beam after passage through a selected one of the array lenslets, a fine deflection correction control, fiducial signal processing circuit means for shaping and amplifying the fiducial marking signals, a station computer and an individual channel controller responsive to the fiducial marking signals for controlling operation of certain of the above-listed control components of the fly's eye type electron beam channels in common in conjunction with the automatic movement means for the movable stage in accordance with preprogrammed lithography processing steps and patterns and for controlling other of the control components individually as determined by the individual characteristics of the several electron beam channels.

10. A multi-channel EBAL apparatus according to claim 9 wherein the common movable stage is selectively movable in an x-y plane that is substantially normal to the electron beam paths of the several electron beam channels by an automatically controlled x-y translation mechanism under the control of said target position control means and mechanically coupled to the movable stage via a flexible and vacuum tight coupling whereby substantially the entire surface area of the target surface can be brought under the combined fields of view of a plurality of parallel operated electron beam channels.

11. A multi-channel EBAL apparatus according to claim 10 wherein the target surface is the surface of an semiconductor wafer on which a plurality of semiconductor integrated circuit chips are to be formed.

12. A high capacity, high thru-put EBAL apparatus comprised of a plurality of multi-channel EBAL stations each comprised of apparatus constructed according to claim 10 and further including a system executive computer for controlling operation of the several station computers in the system.

13. A multi-channel EBAL apparatus according to claim 8 wherein one or more of the lenslets and/or its associated fine deflector in one of the array lenslet assemblies may be flawed and wherein said means for automatically moving said common movable stage also comprises means for selectively permuting a target surface on which an electron beam impinges during successive exposures of the target surface to the electron beam whereby the effect of a flawed lenslet in the lenslet array can be overcome by transposition of the area of the target surface previously under the field of view of a flawed lenslet to a new location where it is subject to the field of view of a working lenslet, and wherein said fiducial marking signal producing means produces fiducial marking signals for use in stitching together the boundary of the field of view of adjacent lenslets on the target surface and for reregistration of the target surface after permutation between the same or different electron beam exposure channels, and further including mapping memory means for mapping the location of areas on a target surface which are subject to the field of view of a flawed lenslet and storing the location of flawed lenslet subjected area of the target surface for subsequent readout and use with the fiducial marking signals for controlling operation of the electron beam following permutation of the target surface to a new location where the flawed lenslet subjected areas are subject to the field of view of a working lenslet.

14. A multi-channel EBAL apparatus according to claim 13 wherein each electron beam channel of the fly's eye type further includes an electron gun disposed within the channel, supplied by an electron gun power supply, electron beam blanking electrodes supplied by an electron beam blanker control for blanking the electron beam prior to its passage through the channel, an electron beam spot size selection optical system under the control of an electron beam spot size selection control for controlling the cross-sectional dimensions of the electron beam used to perform electron beam lithography, an electron beam steering deflector assembly under the control of an electron beam steering control, a stigmator under the control of a stigmation control for correcting electron beam astigmatism and a coarse deflector connected to and controlled by a coarse deflection control; each of said fly's eye type electron beam channels further including a lenslet array connected to and controlled by an array lenslet focus control, a fine deflector assembly connected to and controlled by a fine deflection control for controlling fine deflection of the electron beam after passage through a selected one of the array lenslets, a fine deflection correction control, fiducial signal processing circuit means for shaping and amplifying the fiducial marking signals, a station computer and an individual channel controller responsive to the fiducial marking signals for controlling operation of certain of the above-listed control components of the fly's eye type electron beam channels in common in conjunction with the automatic movement means for the movable stage in accordance with preprogrammed lighography processing steps and patterns and for controlling other of the control components individually as determined by the individual characteristics of the several electron beam channels.

15. A multi-channel EBAL apparatus according to claim 14 wherein the common movable stage is selectively movable in an x-y plane that is substantially normal to the electron beam paths of the several electron beam channels by an automatically controlled x-y translation mechanism under the control of said target position control means and mechanically coupled to the movable stage via a flexible and vacuum tight coupling whereby substantially the entire surface area of the target surface can be brought under the combined fields of view of the plurality of parallel operated electron beam channels, said target position control means also being indirectly under the control of said mapping memory means via the station computer and the individual channel controller.

16. A multi-channel EBAL apparatus according to claim 15 wherein the target surface is the surface of semiconductor wafer on which a plurality of semiconductor integrated circuit chips are to be formed.

17. A high capacity, high thru-put EBAL apparatus comprised of a plurality of multi-channel EBAL stations each comprised of apparatus constructed according to claim 15 and further including a system executive computer for controlling operation of the several station computers in the system.

18. A multi-channel EBAL apparatus according to claim 1 further including means for mechanically moving the center axis position of at least the outer arranged electron beam channels relative to each other in order to accommodate various periodicities of repetitive patterns without loss of efficiency.

19. A multi-channel EBAL apparatus according to claim 4 further including means for mechanically moving the center axis position of at least the outer arranged electron beam channels relative to each other in order to accommodate various periodicities of repetitive patterns without loss of efficiency, and column position drive means responsive to the station computer for automatically mechanically moving the center axis of the electron beam channels to a desired position relative to the target surface in a preprogrammed manner.

20. A multi-channel EBAL apparatus according to claim 19 further including a lenslet stitching calibration grid formed on or near the target surface for identifying the boundaries of the field of view of the respective lenslets within each array lenslet assembly as well as the boundaries of the field of view of each array lenslet assembly, fiducial marking signal producing means for deriving fiducial marking signals from said lenslet stitching calibration grid for identifying the boundaries of the field of view of the respective lenslets in each array and for each array lenslet assembly for use as desired in stitching together the combined field of view of any or all the lenslets and any or all the array lenslet assemblies to thereby cover a desired area of the target surface.

21. A multi-channel EBAL apparatus according to claim 20 further including fiducial signal processing circuit means for shaping and amplifying the fiducial marking signals, and wherein the station computer and the individual channel controller are responsive to the fiducial marking signals while controlling operation of the fly's eye type electron beam channels.

22. A multi-channel EBAL apparatus according to claim 21 wherein the target surface is the surface of a semiconductor wafer on which a plurality of semiconductor integrated circuit chips are to be formed.

23. A high capacity, high thru-put EBAL apparatus comprised of a plurality of multi-channel EBAL stations each comprised of apparatus constructed according to claim 21 and further including a system executive computer for controlling operation of the several station computers in the system.

24. A multi-channel EBAL apparatus according to claim 20 wherein one or more of the lenslets and/or its associated fine deflector in one of the array lenslet assemblies may be flawed and wherein said means for automatically moving said common movable stage also comprises means for selectively permuting a target surface on which an electron beam impinges during successive exposures of the target surface to the electron beam whereby the effect of a flawed lenslet in the lenslet array can be overcome by transposition of the area of the target surface previously under the field of view of a flawed lenslet to a new location where it is subject to the field of view of a working lenslet, and wherein said fiducial marking signal producing means produces fiducial marking signals for use in stitching together the boundary of the field of view of adjacent lenslets on the target surface and for reregistration of the target surface after permutation between the same or different electron beam exposure channels, and further including mapping memory means for mapping the location of areas on a target surface which are subject to the field of view of a flawed lenslet and storing the location of flawed lenslet subjected area of the target surface for subsequent readout and use with the fiducial marking signals for controlling operation of the electron beam following permutation of the target surface to a new location where the flawed lenslet subjected areas are subject to the field of view of a working lenslet, said target position control means also being indirectly under the control of said mapping memory means via the station computer and the individual channel controller.

25. A multi-channel EBAL apparatus according to claim 24 further including fiducial signal processing circuit means for shaping and amplifying the fiducial marking signals, and wherein the station computer and the individual channel controller are responsive to the fiducial marking signals while controlling operation of the fly's eye type electron beam channels.

26. A multi-channel EBAL apparatus according to claim 25 wherein the target surface is the surface of a semiconductor wafer on which a plurality of semiconductor integrated circuit chips are to be formed.

27. A high capacity, high thru-put EBAL apparatus comprised of a plurality of multi-channel EBAL stations each comprised of apparatus constructed according to claim 25 and further including a system executive computer for controlling operation of the several station computers in the system.

28. The method of operating an electron beam array lithography system using a plurality of electron beam channels of the array optics type contained within a common evacuated housing, each of said channels comprising an electron gun for producing an electron beam, an array lenslet assembly, an array fine deflector assembly, and a coarse deflector assembly interposed between the electron gun and the array lenslet assembly for selectively directing the electron beam to a desired element of the lenslet array and its associated fine deflector which directs the electron beam to a desired point on a target surface, said method comprising operating all of said array type electron beam channels simultaneously in parallel in response to common pattern controlled deflection signals applied in common to the respective coarse and fine deflector assemblies of each array type electron beam channel to thereby write on different predetermined target surface areas simultaneously of a common enlarged target surface containing all of the target areas and supported within the common evacuated housing beneath the plurality of electron beam channels of the array optics type.

29. The method of operating an EBAL system according to claim 28 wherein the surface area of the common enlarged target surface is substantially equal to the target surface area viewed by the electron beam channels.

30. The method of operating an EBAL system according to claim 28 wherein the surface area of the common enlarged target surface is substantially equal to some integral multiple of the target surface area viewed by the electron beam channel and further including mechanically moving the enlarged target surface selectively in a preprogrammed manner relative to the central axes of the plurality of array type electron beam columns whereby substantially the entire surface area of the common enlarged target surface can be brought under the combined view of the plurality of array type electron beam channels.

31. The method of operating an EBAL system according to claim 30 wherein the common enlarged target surface is selectively moved in an x-y plane that is substantially normal to the electron beam paths of the several electron beam channels.

32. The method of operating an EBAL system according to either claim 30 or 31 wherein the common enlarged target surface is the surface of a semiconductor wafer on which a plurality of semiconductor integrated circuit chips are to be formed and wherein the surface area of each chip is substantially equal to the field of view of one lenslet of the array type electron beam channels or some integral multiple thereof.

33. The method of operating an electron beam array lithography system according to claim 28 further comprising fabricating a lenslet stitching calibration grid having formed thereon a grid-like network of fiducial marking elements, using said calibration grid to derive fiducial marking signals indicative of the boundaries of the field of view of the individual elements of the array lenslet assembly of each electron beam channel, and using said fiducial marking signals to control the respective electron beam channels so as to stitch together the individual fields of view of the elements in the array lenslet assembly of each electron beam channel, and to stitch together the combined fields of view of the array assemblies to cover a desired area of a target surface to be exposed to the electron beams and which is greater in the surface area than the area covered by the field of view of an individual array lenslet element, the lenslet stitching calibration grid having formed thereon fiducial marking elements at positions corresponding to at least a plurality of points along the boundary of the field of view of each lenslet element of the array lenslet assembly of each electron beam channel.

34. The method of operating an EBAL system according to claim 33 wherein the surface area of the common enlarged target surface is substantially equal to the target surface area viewed by the electron beam channels.

35. The method of operating an EBAL system according to claim 33 wherein the surface area of the common enlarged target surface is substantially equal to some integral multiple of the target surface area viewed by the electron beam channel and further including mechanically moving the enlarged target surface selectively in a preprogrammed manner relative to the central axes of the plurality of array type electron beam columns whereby substantially the entire surface area of the common enlarged target surface can be brought under the combined view of the plurality of array type electron beam channels.

36. The method of operating an EBAL system according to claim 35 wherein the common enlarged target surface is selectively moved in an x-y plane that is substantially normal to the electron beam paths of the several electron beam channels.

37. The method of operating an EBAL system according to either claim 35 or 36 wherein the common enlarged target surface is the surface of a semiconductor wafer on which a plurality of semiconductor integrated circuit chips are to be formed and wherein the surface area of each chip is substantially equal to the field of view of one lenslet of the array type electron beam channels or some integral multiple thereof.

38. The method according to claim 33 wherein the target surface is a semiconductor wafer onto which a plurality of integrated circuit chips are to be formed employing electron beam lithography and further comprising forming fiducial marking elements on at least a plurality of points on the boundaries of each chip to thereby form chip registration grids, measuring the x-y coordinate positions of the chip registration grid fiducial elements for mapping purposes, and transforming the chip registration grid mapped coordinate positions into corresponding positions on the lenslet stitching calibration grid by means of which patterns are actually written on the chips with the electron beam channels of the array optics type whereby chip by chip corrections can be made for semiconductor wafer insertion errors due to translation or rotation and for wafer dimensional changes due to expansion or quadrilateral distortion.

39. The method of operating an EBAL system according to claim 38 wherein the surface area of the common enlarged target surface is substantially equal to the target surface area viewed by the electron beam channels.

40. The method of operating an EBAL system according to claim 38 wherein the surface area of the common enlarged target surface is substantially equal to some integral multiple of the target surface area viewed by the electron beam channels and further including mechanically moving the enlarged target surface selectively in a preprogrammed manner relative to the central axes of the plurality of array type electron beam channels whereby substantially the entire surface area of the common enlarged target surface can be brought under the combined view of the plurality of array type electron beam channels.

41. The method of operating an EBAL system according to claim 40 wherein the common enlarged target surface is selectively moved in an x-y plane that is substantially normal to the electron beam paths of the several electron beam channels.

42. The method according to claim 33 wherein increased and greater accuracy can be attained by the addition of more fiducial marks along the boundaries of fields of view of the array lenslet elements on the lenslet stitching calibration grid in order to provide more measurements with which to determine the values of additional constants used in mathematically defining the lenslet stitching calibration grid.

43. The method according to claim 38 wherein increased and greater accuracy can be attained by the addition or more fiducial marks along the boundaries of fields of view of the array lenslet elements on the lenslet stitching calibration grid in order to provide more measurements with which to determine the values of additional constants used in mathematically defining the lenslet stitching calibration grid.

44. The method according to claim 38 further including correcting for height displacement differences due to difference between vertical placement of the lenslet stitching calibration grid and the target surface along the electron beam path axis within the array optic electron beam column.

45. The method according to claim 43 further including correcting for height displacement differences due to difference between vertical placement of the lenslet stitching calibration grid and the target surface along the electron beam path axis within the array optics electron beam column.

46. The method of operating an EBAL system according to claim 45 wherein the surface area of the common enlarged target surface is substantially equal to the target surface area viewed by the electron beam channels.

47. The method of operating an EBAL system according to claim 45 wherein the surface area of the common enlarged target surface is substantially equal to some integral multiple of the target surface area viewed by the electron beam channels and further including mechanically moving the enlarged target surface selectively in a preprogrammed manner relative to the central axes of the plurality of array type electron beam channels whereby substantially the entire surface area of the common enlarged target surface can be brought under the combined view of the plurality of array type electron beam channels.

48. The method of operating an EBAL system according to claim 47 wherein the common enlarged target surface is selectively moved in an x-y plane that is substantially normal to the electron beam paths of the several electron beam channels.

49. The method according to claim 28 wherein one or more of the plurality of electron beam channels of the array optics type has an array lenslet assembly one or more of which may be flawed; such method further including deriving fiducial marking signals from a lenslet stitching calibration grid formed on or near the target surface for identifying the boundaries of the field of view of the respective array of micro-lenslets on the target surface for use in stitching together the combined fields of view of the array lenslets sufficient to cover a desired area of the target surface to be exposed, exposing the desired area of the surface to the electron beam, mapping in a computer memory the location of any spot on the exposed target surface area which was subject to the field of view of a flawed lenslet in an array lenslet assembly while blanking operation of the flawed lenslet, permuting the physical position of the exposed target surface area to a new physical position subject to the field of view of a different set of array lenslets whose combined field of view again covers the desired area of the target surface to be exposed, deriving from the computer memory retrace control signals for controlling operation of at least the coarse deflector and fine deflector assembly of the electron beam channel for redirecting the electron beam back to the previously unexposed spot caused by the flawed lenslet, and retracing the electron beam over such spot in accordance with the master pattern specifications for the spot location on the target surface whereby increased yield from the EBAL system is obtained.

50. The method according to claim 49 further comprising employing the fiducial marking signals derived from the chip registration grid for controlling reregistration of the target surface after removal, partial processing and reinsertion of the target surface in the same or a different EBAL station by automatically controlling positioning of the target surface with the fiducial marking signals relative to the array lenslets and fine deflector assembly to correct for rotation and linear displacement, target insertion errors, as well as target warping, bowing, or other dimensional changes due to intermediary processing of the target, thermal expansion, expansion gradients, differential expansion between the array lenslet assembly and the target and other like errors in positioning of the target surface after its removal, partial processing and reinsertion in the same or a different EBAL station.

51. The method of operating an electron beam array lithography system according to claim 49 further comprising fabricating a lenslet stitching calibration grid having formed thereon a grid-like network of fiducial marking elements, using said calibration grid to derive fiducial marking signals indicative of the boundaries of the field of view of the individual elements of the array lenslet assembly of each electron beam channel, and using said fiducial marking signals to control the respective electron beam channels so as to stitch together the individual fields of view of the elements in the array lenslet assembly of each electron beam channel, and to stitch together the combined fields of view of the array assemblies to cover a desired area of a target surface to be exposed to the electron beams and which is greater in the surface area than the area covered by the field of view of an individual array lenslet element, the lenslet stitching calibration grid having formed thereon fiducial marking elements at positions corresponding to at least a plurality of points along the boundary of the field of view of each lenslet element of the array lenslet assembly of each electron beam channel.

52. The method according to claim 51 wherein the target surface is a semiconductor wafer onto which a plurality of integrated circuit chips are to be formed employing electron beam lithography and further comprising forming fiducial marking elements on at least a plurality of points on the boundaries of each chip to thereby form chip registration grids, measuring the x-y coordinate positions of the chip registration grid fiducial elements for mapping purposes, and transforming the chip registration grid mapped coordinate positions into corresponding positions on the lenslet stitching calibration grid by means of which patterns are actually written on the chips with the electron beam channels of the array optics type whereby chip by chip corrections can be made for semiconductor wafer insertion errors due to translation or rotation and for wafer dimensional changes due to expansion or quadrilateral distortion.

53. The method according to claim 52 wherein increased and greater accuracy can be attained by the addition of more fiducial marks along the boundaries of fields of view of the array lenslet elements on the lenslet stitching calibration grid in order to provide more measurements with which to determine the values of additional constants used in mathematically defining the lenslet stitching calibration grid.

54. The method according to claim 52 further including correcting for height displacement differences due to difference between vertical placement of the lenslet stitching calibrations grid and the target surface along the electron beam path axis within the array optics electron beam column.

55. The method of operating an EBAL system according to claim 54 wherein the surface area of the common enlarged target surface is substantially equal to the target surface area viewed by the electron beam channels.

56. The method of operating an EBAL system according to claim 54 wherein the surface area of the common enlarged target surface is substantially equal to some integral multiple of the target surface area viewed by the electron beam channel and further including mechanically moving the enlarged target surface selectively in a preprogrammed manner relative to the central axes of the plurality of array type electron beam columns whereby substantially the entire surface area of the common enlarged target surface can be brought under the combined view of the plurality of array type electron beam channels.

57. The method according to claim 54 wherein the method is conducted simultaneously in a plurality of parallel operated EBAL stations with each EBAL station comprising a plurality of electron beam channels having the characteristics recited in claim 56 and having a high voltage power and electron gun power supply, stage control, and a complete pattern memory controlled in common by an overall system executive computer and blanking, spot selection control, beam steering, stigmation, coarse and fine deflection chip registration, lenslet stitching, and flawed lenslet mapping memory and control all individually controlled for each station by an individual station computer either alone or in conjunction with an individual channel controller.

58. An EBAL system according to claim 28 wherein there are a plurality of parallel operated EBAL stations with each EBAL station comprising a plurality of electron beam channels having the characteristics recited in claim 28 and further including a system executive computer for controlling the operation of certain components of all of the array optics type electron beam channels of the plurality of EBAL stations in common and a plurality of individual station computers each respectively associated with an individual EBAL station and an individual electron beam channel controller for controlling the operation of the remaining components of its respective electron beam tube alone or in conjunction with each other.

59. The method according to claim 28 further including mechanically moving the center axis position of at least the outer arranged electron beam channels relative to each other in order to accommodate various periodicities of repetitive patterns without loss of efficiency.

60. The method according to claim 57 further including mechanically moving the center axis position of at least the outer arranged electron beam channels relative to each other in order to accommodate various periodicities of repetitive patterns without loss of efficiency and automatically mechanically moving the center axis of the electron beam channels to a desired position relative to the target surface in a preprogrammable manner in response to the station computer.

* * * * *